(12) United States Patent
Ehmke

(10) Patent No.: US 11,167,983 B2
(45) Date of Patent: Nov. 9, 2021

(54) SELECTIVE WAFER REMOVAL PROCESS FOR WAFER BONDING APPLICATIONS

(71) Applicant: TEXAS INSTRUMENTS INCORPORATED, Dallas, TX (US)

(72) Inventor: John Charles Ehmke, Garland, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 42 days.

(21) Appl. No.: 16/450,138

(22) Filed: Jun. 24, 2019

(65) Prior Publication Data

US 2020/0223690 A1 Jul. 16, 2020

Related U.S. Application Data

(60) Provisional application No. 62/792,047, filed on Jan. 14, 2019.

(51) Int. Cl.
*B81B 1/00* (2006.01)
*B81C 1/00* (2006.01)
*G02B 26/08* (2006.01)

(52) U.S. Cl.
CPC .. *B81C 1/00785* (2013.01); *B81C 2203/0109* (2013.01); *B81C 2203/0118* (2013.01); *G02B 26/0833* (2013.01)

(58) Field of Classification Search
CPC .................................................. B81C 1/00785
USPC ........................................................ 438/458
See application file for complete search history.

(56) References Cited

U.S. PATENT DOCUMENTS

| | | | | | |
|---|---|---|---|---|---|
| 4,779,004 | A | * | 10/1988 | Tew | H01L 21/465 250/332 |
| 5,710,068 | A | * | 1/1998 | Hill | H01L 23/481 438/171 |
| 6,432,744 | B1 | * | 8/2002 | Amador | H01L 21/50 438/108 |
| 6,730,541 | B2 | * | 5/2004 | Heinen | H01L 21/67138 257/E23.067 |
| 10,392,246 | B2 | * | 8/2019 | Ararao | H01L 23/3135 |
| 2001/0020545 | A1 | * | 9/2001 | Eldridge | H01L 21/4853 174/260 |
| 2010/0065963 | A1 | * | 3/2010 | Eldridge | B23K 20/004 257/734 |
| 2011/0020545 | A1 | * | 1/2011 | Kim | C23C 16/4584 427/248.1 |

(Continued)

*Primary Examiner* — Jami Valentine Miller
(74) *Attorney, Agent, or Firm* — Michelle F. Murray; Charles A. Brill; Frank D. Cimino

(57) ABSTRACT

A method includes attaching an optically transparent wafer to a first surface of an interposer wafer. The interposer wafer has a second surface opposite the first surface, and the second surface has a first channel therein. The method further includes attaching the interposer wafer to a first surface of a semiconductor wafer, and etching a second channel through the optically transparent wafer and through the interposer wafer. The method then includes applying wax into the second channel, and sawing through the optically transparent wafer and through at least a portion of the interposer wafer to form a third channel having a width that is wider than a width of the second channel. The wax is then removed to expose a portion of the first surface of the semiconductor wafer.

8 Claims, 3 Drawing Sheets

(56) References Cited

U.S. PATENT DOCUMENTS

2018/0186629 A1\* 7/2018 Ararao ................... B81B 7/007
2020/0009556 A1\* 1/2020 Zimmerley ....... B01L 3/502746

\* cited by examiner

SELECTIVE WAFER REMOVAL PROCESS FOR WAFER BONDING APPLICATIONS

CROSS-REFERENCE TO RELATED APPLICATIONS

This application claims priority to U.S. Provisional Application No. 62/792,047, filed Jan. 14, 2019, which is hereby incorporated by reference.

BACKGROUND

In wafer level packaging, the packaging process for individual semiconductor dies begins before the semiconductor wafer has been singulated into the individual dies and the dies removed from a chuck on which the semiconductor wafer is adhered. In some cases, the semiconductor wafer is adhered to the chuck and singulated while still on the chuck. A packaging material (e.g., glass) can then be placed over the semiconductor wafer and further processed as part of the packaging process. It is possible that portions of the semiconductor wafer become damaged while processing the packing material over the wafer. For example, portions of the glass may be removed and the glass portion removal process may result in damage to the underlying semiconductor wafer.

SUMMARY

In one example, a method includes attaching an optically transparent wafer to a first surface of an interposer wafer. The interposer wafer has a second surface opposite the first surface, and the second surface has a first channel therein. The method further includes attaching the interposer wafer to a first surface of a semiconductor wafer, and etching a second channel through the optically transparent wafer and through the interposer wafer. The method then includes applying wax into the second channel, and sawing through the optically transparent wafer and through at least a portion of the interposer wafer to form a third channel having a width that is wider than a width of the second channel. The wax solution is then removed to expose a portion of the first surface of the semiconductor wafer.

BRIEF DESCRIPTION OF THE DRAWINGS

For a detailed description of various examples, reference will now be made to the accompanying drawings in which.

DETAILED DESCRIPTION

As noted above, damage can occur to a semiconductor wafer during wafer level packaging. The described examples reduce or avoid such damage through the use of a liquid wax, or other type of low viscosity, solventless fluid that is readily removed from the final product. The viscosity of the fluid is low enough to permit the fluid to flow, through capillary-action, into one or more channels in an assembly comprising a semiconductor wafer, an interposer wafer, and a top wafer (e.g., an optically transparent wafer such as glass). The liquid wax then hardens, and the channel containing the solid water-soluble wax is then widened via a saw. The solid wax retains in place portions of the wafers subject to the saw. The temperature of the solid wax is elevated to melt the wax, which then flows away from the assembly of wafers taking the wafer portions with it, and thus without damaging the semiconductor wafer.

Figure 1:
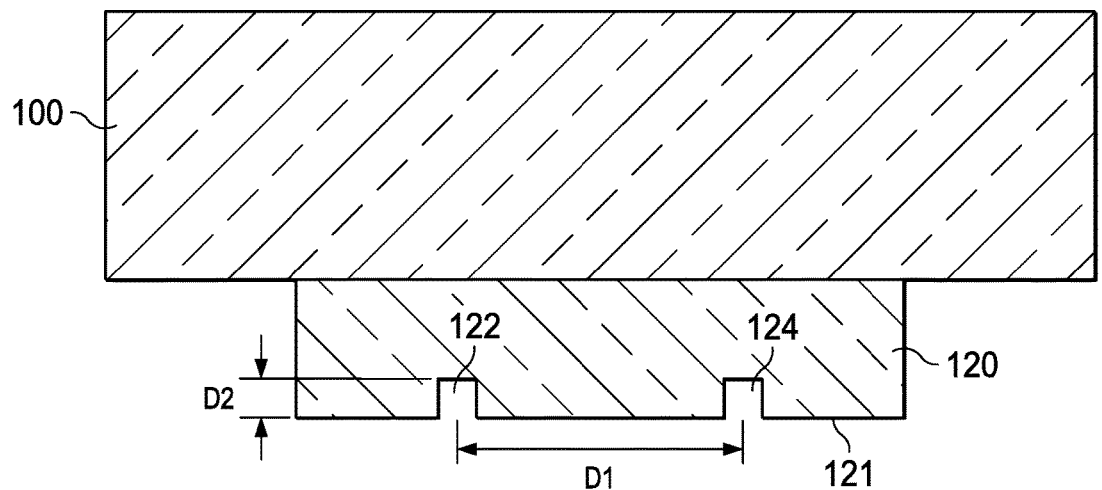
FIG. 1 illustrates an example of a first wafer attached to an interposer wafer.

FIGS. 1-6 illustrate an example of the method described above. FIG. 1 illustrates a first wafer 100 attached to an interposer wafer 120. In some implementations, the first wafer 100 comprises an optically transparent material such as glass. The interposer 120 also may be made from an optically translucent material such as glass, and is adhered to the first wafer 100 by way of, for example, glue or other type of adhesive. One or more channels 122 and 124 are etched into surface 121 of the interposer wafer 120. In one example, the channels 122, 124 are etched with a laser. The spacing D1 (channel center-to-channel center) is within a range of distances, for example, 0.2 mm to 0.8 mm. The depth D2 of the channels is, for example, 0.04 mm to 0.5 mm.

Figure 2:
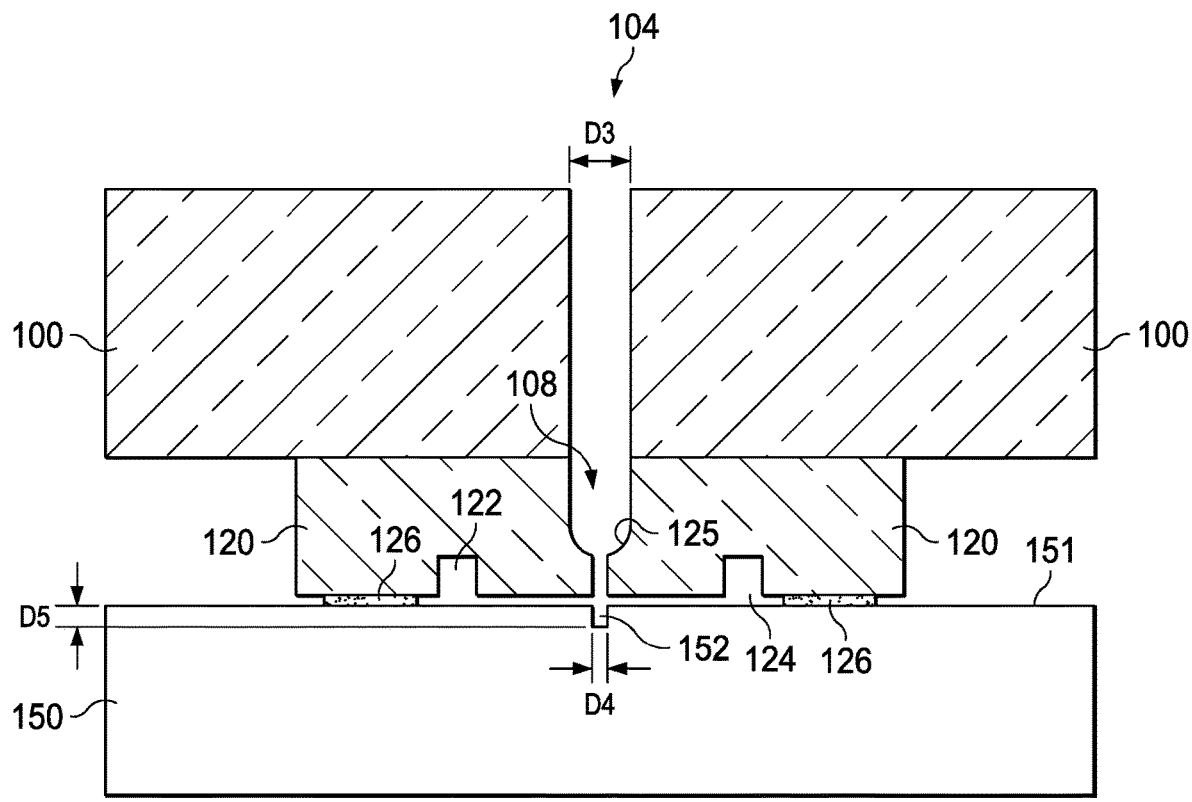
FIG. 2 illustrates the example structure of FIG. 1 attached to a semiconductor wafer.

FIG. 2 illustrates that the surface 121 of the interposer wafer 120 is attached to a surface 151 of a semiconductor wafer 150. In this example, the interposer wafer 120 is attached to the semiconductor wafer 150 via epoxy bonds 126. The semiconductor wafer 150 includes one more integrated circuits formed thereon. In one example, one or more of the integrated circuits along with corresponding arrays of micromirrors are usable to implement digital micromirror devices (DMD). For a DMD, the first wafer 100 comprises glass to permit light to penetrate through the first wafer 100.

FIG. 2 also illustrates that a channel 104 of width D3 is etched through the first wafer 100 and through a portion of the interposer wafer 120. In the example in which wafers 100 and 120 are made from glass, a saw blade is used to etch channel 104 that is suitable for cutting through glass. The channel 104 is cut through the interposer wafer 120, but all of the way through the wafer 120 as shown. A second, thinner saw blade is then used to continue etching channel 104 through the remaining portion 125 of the interposer wafer 120 as shown at 108. The width of the channel 104 at 108 is D4, and D4 is less than D3. The saw blade used to complete the channel at 108 is a saw blade suitable for cutting a semiconductor wafer. The channel 104 is completed into the surface 151 of the semiconductor wafer 150 as shown at 152. The depth of the channel 104 with the semiconductor wafer 150 is D5. In one example, D5 is within a range of, for example, 0.04 mm to 0.5 mm.

Figure 3:
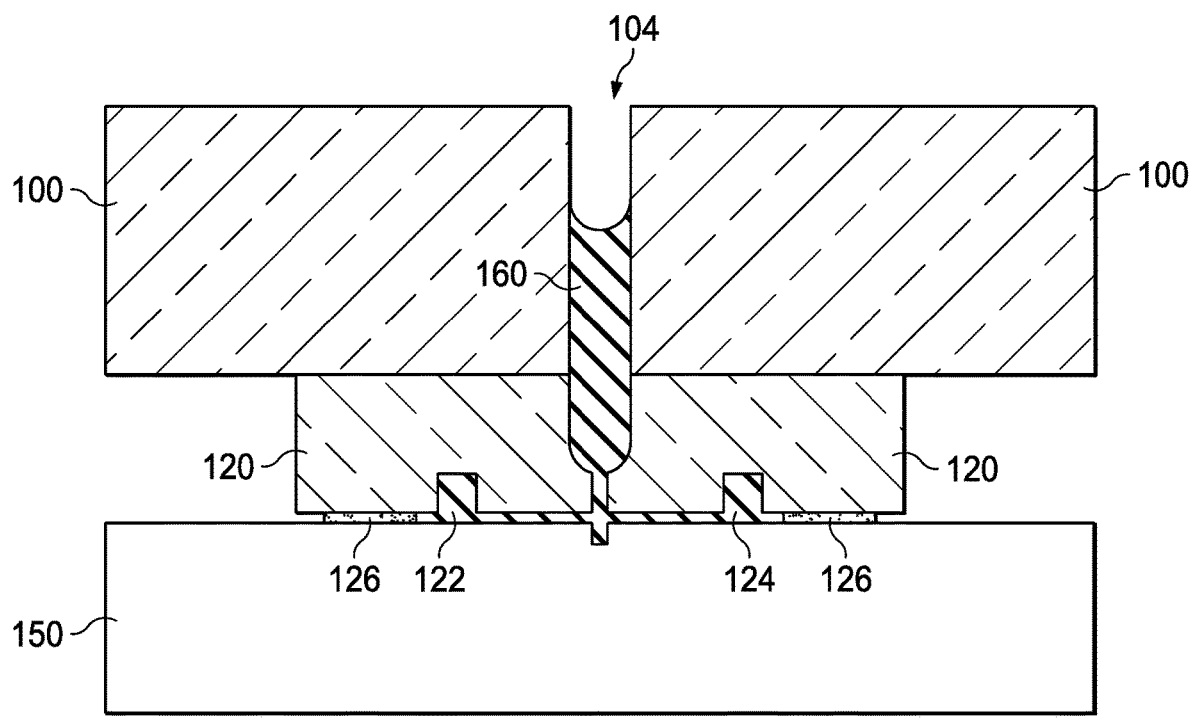
FIG. 3 illustrates a liquid wax applied to a channel formed in the structure of FIG. 2.

The epoxy bonds 126 between the bottom surface 127 of interposer wafer 120 facing the top surface 151 of the semiconductor wafer 150 create a space that between channel 104 and channels 122 and 124. FIG. 3 illustrates a liquid wax 160 applied into the channel 104. The liquid wax 160 flows into the channel 104, and through the space created by the epoxy bonds 126 and into the channels 122, 124. In one example, the liquid wax 160 has a viscosity in the range of 100 centipoise (cps) to 1600 cps at a temperature of 170 degrees Fahrenheit. The wax is heated to a temperature (e.g., 170 degrees Fahrenheit) to melt the wax to form a liquid wax. The liquid wax 160 is then introduced into the channel 104. With the wax melted at the elevated temperature, the liquid flows into the channel 104 and thus into channels 122 and 124 as well. After the liquid wax 160 has flowed into the cavities 122 and 124, the temperature of the assembly is reduced to at least the temperature at which the wax hardens. The wax used in this example also has low levels of certain ions that may otherwise be harmful to the semiconductor wafer 150. The wax has relatively low levels of fluorine, chlorine, sodium, potassium, and ammonium ions.

Figure 4:
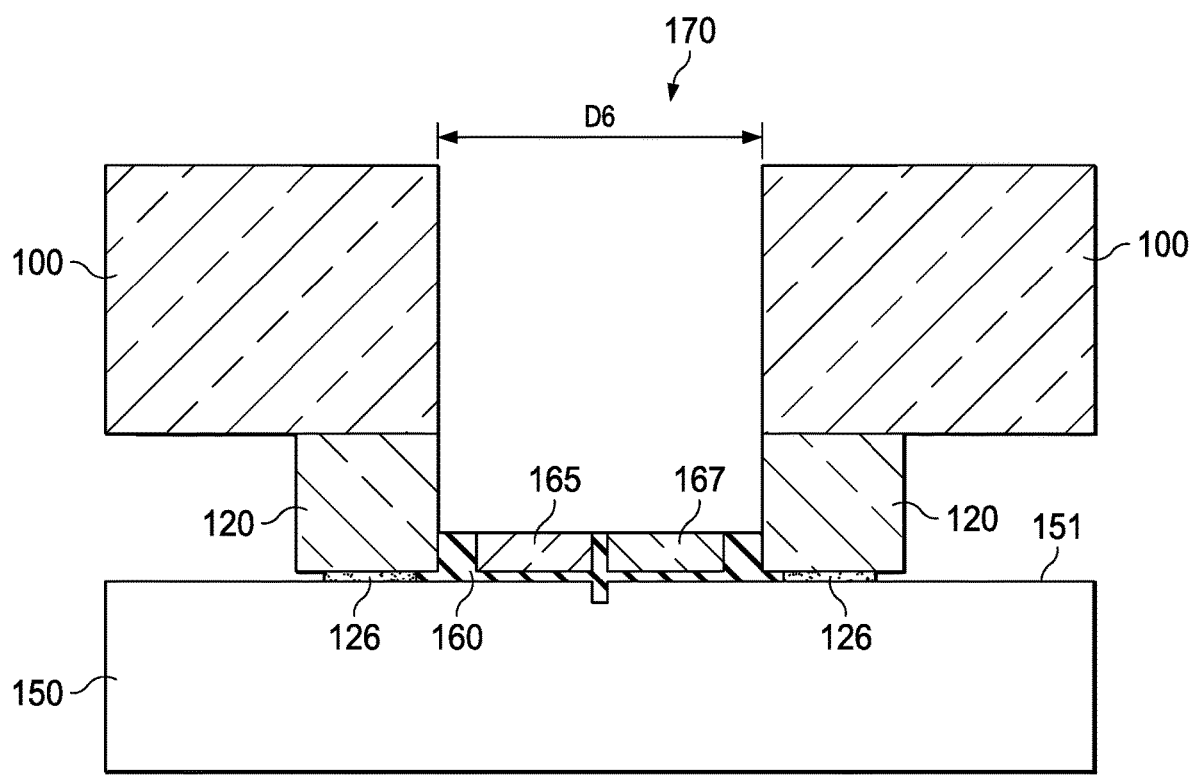
FIG. 4 illustrates a larger channel cut into the structure at the location of the channel containing the wax.

FIG. 4 illustrates that a wider channel 170 is then sawed through the first wafer 100 and through some, but not all, of the interposer wafer 120. The width of channel 170 is D6. In one example, D6 is in the range of 0.2 mm to 0.8 mm. Channel 170 is cut using a saw blade having a width that is larger than the saw blade used to cut channel 104. As can be seen, some of the bottom portions 165 and 167 of the interposer wafer 120 remain within the channel 170, but held in place by the hardened water-soluble wax 160. The solid wax prevents the portions 165 and 167 of the interposer wafer 120 from contacting and damaging the top surface 151 of the semiconductor wafer 150.

Figure 5:
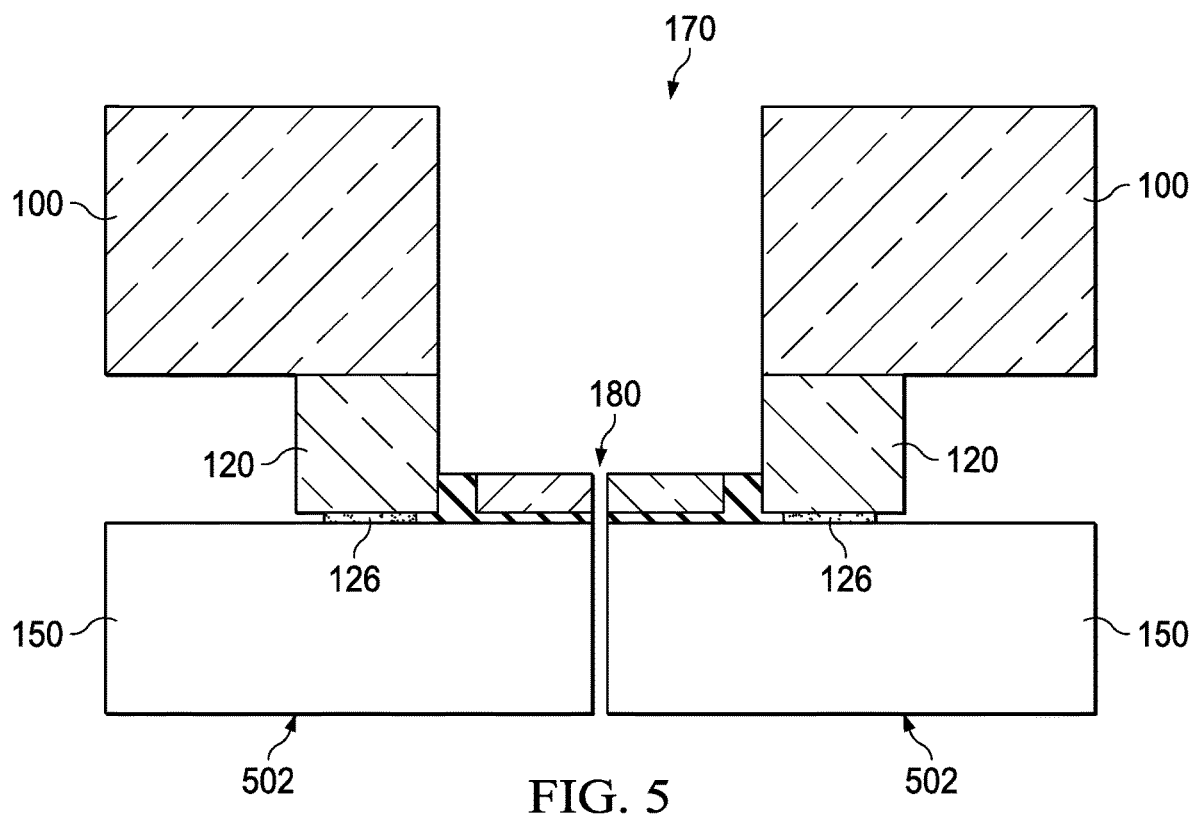
FIG. 5 illustrates the singulation of the semiconductor wafer.

FIG. 5 illustrates that a thinner saw blade (thinner than that used to cut channels 104 or 170) is used to saw all the way through the semiconductor wafer as shown at 180, thereby singulating the semiconductor wafer 150 and corresponding interposer wafer 120 and first wafer (e.g., glass) 100 into individual semiconductor devices 502 (e.g., DMD devices). The width of the saw bladed used to cut through the semiconductor wafer 150 may be the same width (e.g., same saw blade) used to complete forming the channel 104 at 108 in FIG. 2.

Figure 6:
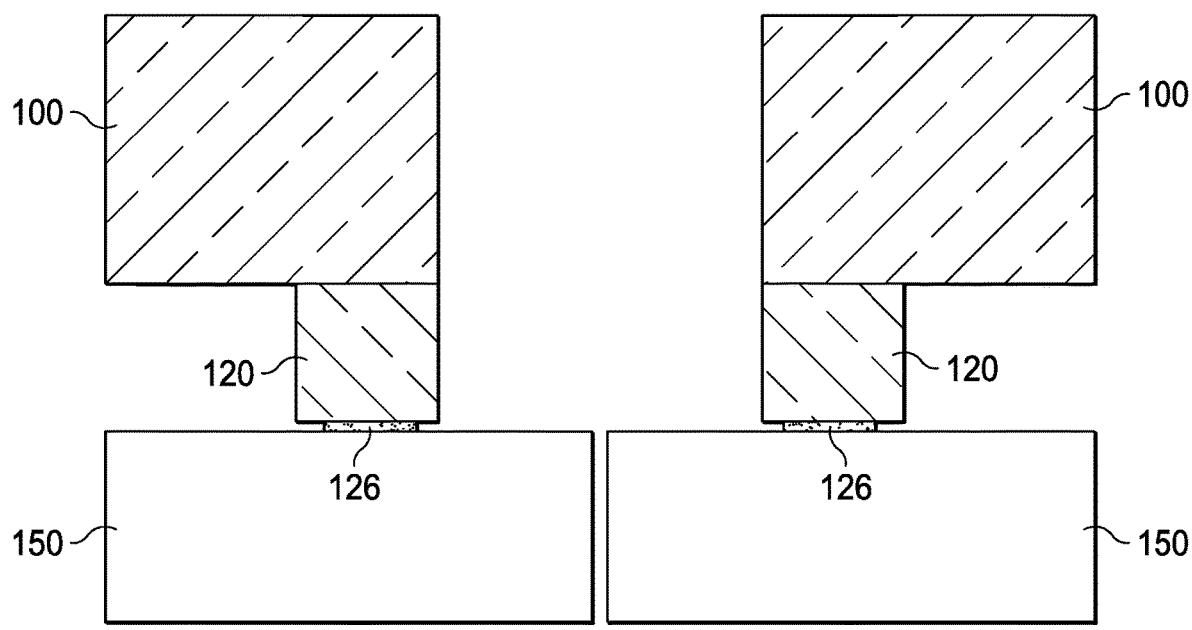
FIG. 6 illustrates the melting and removal of the wax

FIG. 6 illustrates that the solid wax 160 has been removed along with the bottom portions 165 and 167 of the interposer wafer 120 that had been trapped within the wax. In one example, the solid wax 160 is removed by heating the solid wax to a temperature (e.g., 170 degrees Fahrenheit) in excess of the melting point of the wax. The solid wax solution may be exposed to water at a temperature equal to or above the melting point of the wax. For example, the assembly shown in FIG. 5 can be inverted from that shown in FIG. 5 and dipped into an elevated temperature bath to melt the wax. The assembly is then removed from the water bath and the wax and portions 165 and 167 of the interposer wafer 120 remain in the water bath.

Modifications are possible in the described embodiments, and other embodiments are possible, within the scope of the claims.

What is claimed is:

1. A method, comprising:
   attaching a first wafer to a first surface of an interposer wafer, the interposer wafer having a second surface opposite the first surface, the second surface having a first channel therein;
   attaching the second surface of the interposer wafer to a first surface of a semiconductor wafer;
   etching a second channel through the first wafer and through the interposer wafer, the second channel bisecting the first wafer and the interposer wafer;
   applying a liquid into the second channel;
   reducing a temperature of the liquid to cause the liquid to harden to form a solid material;
   sawing a third channel through the first wafer and through a portion of the interposer wafer, the third channel encompassing and wider than the second channel; and
   elevating the temperature of the solid material.

2. The method of claim 1, wherein the liquid comprises wax.

3. The method of claim 1, wherein elevating the temperature of the solid material comprises elevating the temperature above a melting point of the solid material.

4. The method of claim 1, wherein the first wafer is optically-transparent.

5. The method of claim 1, wherein the first wafer includes glass.

6. The method of claim 1, wherein the third channel has a width that is wider than a width of the second channel.

7. The method of claim 1, wherein:
   the liquid comprises wax;
   the second surface of the interposer wafer has a fourth channel;
   the wax flows into the first and fourth channels;
   sawing through the first wafer and through at least a portion of the interposer wafer comprises sawing to the wax within the first and fourth channels.

8. The method of claim 1, wherein the semiconductor wafer comprises a digital micromirror device.

* * * * *